US012787411B2

(12) United States Patent
Nebesnyi et al.

(10) Patent No.: US 12,787,411 B2
(45) Date of Patent: Nov. 3, 2026

(54) SEMICONDUCTOR POWER DEVICE

(71) Applicant: VoltA Semiconductor, Inc., Cupertino, CA (US)

(72) Inventors: Valerii Nebesnyi, Aphrodite Hills (CY); Yuniarto Widjaja, Cupertino, CA (US); Nikolas Xeni, Limassol (CY); Meng Duan, Glasgow (GB); Asen Asenov, Glasgow (GB); Ismail Topaloglu, Glasgow (GB); Djamel Bensouiah, Reading (GB)

(73) Assignee: Volta Semiconductor, Inc., Cupertino, CA (US)

(*) Notice: Subject to any disclaimer, the term of this patent is extended or adjusted under 35 U.S.C. 154(b) by 0 days.

(21) Appl. No.: 19/564,761

(22) Filed: Mar. 12, 2026

(65) Prior Publication Data

US 2026/0206283 A1 Jul. 16, 2026

Related U.S. Application Data

(63) Continuation of application No. PCT/US2024/046107, filed on Sep. 11, 2024.

(60) Provisional application No. 63/574,846, filed on Apr. 4, 2024, provisional application No. 63/582,062, filed on Sep. 12, 2023.

(51) Int. Cl.
*H10D 64/27* (2025.01)
*H03K 17/687* (2006.01)
*H10D 30/65* (2025.01)
*H10D 30/66* (2025.01)

(52) U.S. Cl.
CPC ......... *H10D 64/529* (2025.01); *H03K 17/687* (2013.01); *H10D 30/65* (2025.01); *H10D 30/668* (2025.01); *H10D 64/513* (2025.01); *H10D 64/518* (2025.01)

(58) Field of Classification Search
CPC .... H03K 17/687; H10D 30/65; H10D 30/668; H10D 10/00; H10D 64/529
See application file for complete search history.

(56) References Cited

U.S. PATENT DOCUMENTS

2009/0283826 A1* 11/2009 Shea .................. H10D 30/0221 438/286
2017/0263766 A1* 9/2017 Xia ...................... H03K 17/687
2022/0190116 A1* 6/2022 Dutta ................... H10D 30/027

* cited by examiner

*Primary Examiner* — Steven M Page
(74) *Attorney, Agent, or Firm* — Kolitch Romano Dascenzo Gates LLP

(57) ABSTRACT

Semiconductor power devices having lower resistance and higher breakdown voltage are disclosed. Methods of operating the semiconductor power devices are disclosed.

18 Claims, 19 Drawing Sheets

SEMICONDUCTOR POWER DEVICE

RELATED APPLICATIONS

This application claims priority under 35 U.S.C. § 120 to International Patent Application No. PCT/US2024/046107, which was filed on Sep. 11, 2024, and which claims priority under 35 U.S.C. § 119 to U.S. Provisional Patent Application No. 63/574,846, which was filed on Apr. 4, 2024, and to U.S. Provisional Patent Application No. 63/582,062, which was filed on Sep. 12, 2023. The complete disclosures of the above-identified patent applications are hereby incorporated by reference.

FIELD OF THE INVENTION

The present invention relates to semiconductor power devices.

BACKGROUND OF THE INVENTION

Semiconductor power devices are used extensively in many applications.

SUMMARY OF THE INVENTION

Semiconductor power devices having lower resistance and higher breakdown voltage are disclosed. A method of operating the semiconductor power devices is disclosed.

According to an aspect of the present invention, a semiconductor power device is provided that includes: a drain region; a first region contacting the drain region and having a same conductivity type as a conductivity type of the drain region, the first region being more lightly doped compared to a doping of the drain region; a source region; a second region in contact with the first region and the source region; a gate region; a gate insulator layer positioned at least in part between the gate region and the second region; a body electrode configured to provide bias to the second region; and a source electrode configured to provide bias to the source region; wherein independent control of the second region and the source region are enabled.

In at least one embodiment, when in a conducting mode, application of a positive voltage to the second region while about zero voltage is applied to the source region, results in a higher current flow from the drain region to the source region, compared to configurations where the second region is shorted to the source region.

In at least one embodiment, when in a conducting mode, a positive voltage is applied to the gate region, a positive voltage is applied to the drain region, about zero voltage is applied to the source region, and a positive voltage is applied to the second region.

In at least one embodiment, a positive bias applied to the second region turns on an intrinsic lateral bipolar transistor, wherein the source region functions as an emitter region of the lateral bipolar transistor, the second region functions as a base region of the lateral bipolar transistor, and the first region and the drain region function as a collector region of the lateral bipolar transistor.

In at least one embodiment, when the device is turned off, a negative bias is applied to the second region to increase an energy barrier between the drain region and the source region, thereby suppressing punch-through and increasing a breakdown voltage of the device compared to when the second region is grounded.

In at least one embodiment, the device comprises an LDMOS device.

In at least one embodiment, the second region comprises a body region, the device further including: a substrate; and a third region between the substrate and the second region and in contact with the substrate and the second region.

In at least one embodiment, the semiconductor power device further includes a body contact region in electrical contact between the body electrode and the body region, wherein the body contact region is more highly doped compared to a doping of the body region.

In at least one embodiment, the body contact region extends deeper into the device than a depth of the body region.

In at least one embodiment, the device comprises a VMOS device.

In at least one embodiment, the drain region comprises a substrate; the first region comprises a drift region; and the gate region and the gate insulator layer are formed inside a V-shaped groove cutting the source region, the second region, and into the drift region.

In at least one embodiment, the device comprises a UMOS device.

In at least one embodiment, the drain region comprises a substrate; the first region comprises a drift region; and the gate region and the gate insulator layer are formed in a U-shaped trench.

In at least one embodiment, the device comprises a VDMOS device.

In at least one embodiment, the drain region comprises a substrate; the first region comprises a drift region; and wherein current flows from the drain region to the source region in a conducting state.

In at least one embodiment, the device comprises a super-junction vertical channel semiconductor power device.

In at least one embodiment, the drain region comprises a substrate; the first region comprises a drift region having a same conductivity type as a conductivity type of the substrate and being more lightly doped than the substrate; the semiconductor power device further includes a vertical region in contact with the second region and the drift region, the vertical region having a different conductivity type from the conductivity type of the drift region.

According to another aspect of the present invention, an insulated-gate bipolar transistor (IGBT) semiconductor power device includes a substrate having a first conductivity type; a drift region contacting the substrate and having a second conductivity type different from the first conductivity type; a base region having the first conductivity type and contacting the drift region; an emitter region contacting the base region and having the second conductivity type; a gate insulating layer and gate region located above the drift region and overlaying a portion of the base region; a body electrode electrically connected to the base region; and an emitter electrode electrically connected to the emitter region; wherein independent control of the base region and the emitter region are enabled.

In at least one embodiment, the IGBT semiconductor power device further includes a collector electrode electrically connected to the substrate; wherein the IGBT semiconductor power device is a vertical channel device, where current flows from the collector electrode to the emitter electrode in a conducting state; wherein the power device is turned on by applying a positive voltage to the gate region, and the base region underneath the gate insulating layer is inverted, forming a channel region connecting the emitter region and the drift region.

In at least one embodiment, when the power device is in conducting mode, about zero voltage is applied to the emitter region and a positive voltage is applied to the base region, resulting in a higher current flow from the substrate to the emitter region compared to if the base region were to be grounded.

In at least one embodiment, when the IGBT semiconductor power device is turned off, a negative bias is applied to the body electrode, thereby increasing an energy barrier between the drift region and the emitter region, suppressing punch-through and increasing a breakdown voltage of the IGBT semiconductor power device, compared to if the base region were to be grounded.

In at least one embodiment, application of negative bias to the base region improves a latch-up immunity of the IGBT semiconductor power device as the potential of the base region can be limited below a latch-up condition of a thyristor device formed by the substrate, the drift region, the base region and the emitter region.

According to an aspect of the present invention, a method of operating a semiconductor power device having a drain region, a first region contacting the drain region and having a same conductivity type as a conductivity type of the drain region and being more lightly doped than the drain region, a source region, a second region in contact with the first region and the source region, a gate region, a gate insulator layer positioned at least in part between the gate region and the second region, a body electrode configured to provide bias to the second region, and a source electrode configured to provide bias to the source region is provided, the method including: applying a first bias from the body electrode to the second region; and applying a second bias from the source electrode to the source region; wherein the first and second biases are independently controlled.

In at least one embodiment, when in a conducting mode, a positive voltage is applied to the gate region, a positive voltage is applied to the drain region, the second bias is about zero voltage applied to the source region, and the first bias is a positive voltage applied to a body contact region electrically connected to the second region; wherein a higher current flow from the drain region to the source region results, compared to if the body contact region had been grounded.

In at least one embodiment, the positive bias applied to the second region through the body contact region also turns on an intrinsic lateral bipolar transistor where the source region functions as an emitter region, the second region functions as a base region, and the first region and drain region function as a collector region of the bipolar transistor.

According to an aspect of the present invention, a method of operating a semiconductor power device having a drain region, a first region contacting the drain region and having a same conductivity type as a conductivity type of the drain region and being more lightly doped than the drain region, a source region, a second region in contact with the first region and the source region, a gate region, a gate insulator layer positioned at least in part between the gate region and the second region, a body electrode configured to provide bias to the second region, and a source electrode configured to provide bias to the source region is provided, the method including: applying a negative bias to the second region when turning off the semiconductor power device, thereby increasing an energy barrier between the drain region and the source region, hence suppressing punch-through and increasing a breakdown voltage of the semiconductor power device compared to if the second region were to be grounded when turning off the device.

In at least one embodiment, the application of a negative bias to the second region also reduces leakage current between the drain region and the source region when the semiconductor power device is turned off, when the gate region is turned off by applying about 0V bias.

In at least one embodiment, the application of a negative bias to the second region removes charge in the second region and thereby improves a switch-off time of the semiconductor power device.

In at least one embodiment, the method further includes applying a negative bias to the gate region in conjunction with the applying negative bias to the second region.

In at least one embodiment, the bias is a voltage bias.

In at least one embodiment, the bias is a current bias.

According to an aspect of the present invention, a method of of operating an insulated-gate bipolar transistor (IGBT) semiconductor power having a substrate having a first conductivity type, a drift region contacting the substrate and having a second conductivity type different from the first conductivity type, a base region having the first conductivity type and contacting the drift region, an emitter region contacting the base region and having the second conductivity type, a gate insulating layer and gate region located above the drift region and overlaying a portion of the base region, a body electrode electrically connected to the base region, and an emitter electrode electrically connected to the emitter region is provided; the method including: applying a first bias from the body electrode to the base region; and applying a second bias from the emitter electrode to the emitter region; wherein the first and second biases are independently controlled.

In at least one embodiment, the IGBT semiconductor power device further includes a collector electrode electrically connected to the substrate and the IGBT semiconductor power device is a vertical channel device, where current flows from the collector electrode to the emitter electrode in a conducting state; the method further including: turning on the power device by applying a positive voltage to the gate region, thereby inverting the base region underneath the gate insulating layer and forming a channel region connecting the emitter region and the drift region.

In at least one embodiment, when the power device is in conducting mode, the method includes applying about zero voltage to the emitter region and applying a positive voltage to the base region, resulting in a higher current flow from the substrate to the emitter region compared to if the base region were to be grounded.

In at least one embodiment, the method further includes turning off the IGBT semiconductor power device, including applying a negative bias to the body electrode, thereby increasing an energy barrier between the drift region and the emitter region, suppressing punch-through and increasing a breakdown voltage of the IGBT semiconductor power device, compared to if the base region were to be grounded.

In at least one embodiment, the application of a negative bias to the base region improves a latch-up immunity of the IGBT semiconductor power device as the potential of the base region can be limited below a latch-up condition of a thyristor device formed by the substrate, the drift region, the base region and the emitter region.

In at least one embodiment, the first and second biases are voltage biases.

In at least one embodiment, the first and second biases are current biases.

According to an aspect of the present invention, a driver circuitry for generating signals to operate at least one semiconductor power device is provided, wherein the driver circuitry generates two signals for each of the at least one semiconductor power device.

In at least one embodiment, the semiconductor power device comprises a gate electrode and a body electrode.

In at least one embodiment, the two signals include a signal to control the gate electrode of the semiconductor power device and a signal to control the body electrode of the semiconductor power device.

In at least one embodiment, the signals to the gate electrode and body electrode can be independently controlled.

In at least one embodiment, one of the signals has a higher driver current capability than the other of the signals.

In at least one embodiment, the polarity of the signals can be positive or negative.

According to an aspect of the present invention, a power system includes: a driver circuitry, and at least one semiconductor power device, wherein the driver circuitry generates two signals for each of the at least one semiconductor power device.

In at least one embodiment, each semiconductor power device includes a gate electrode and a body electrode.

In at least one embodiment, the two signals comprise a signal to control the gate electrode and a signal to control the body electrode.

In at least one embodiment, the signals to the gate electrode and body electrode can be independently controlled.

In at least one embodiment, one of the signals has a higher driver current capability than the other of the signals.

In at least one embodiment, the polarity of the signals can be positive or negative.

According to an aspect of the present invention, a method of reducing variations in a semiconductor power device, includes applying a bias to a body electrode of the semiconductor power device.

According to an aspect of the present invention, a method of adjusting semiconductor power device properties includes applying a bias to a body electrode of the semiconductor power device.

These and other advantages and features of the invention will become apparent to those persons skilled in the art upon reading the details of the embodiments as more fully described below.

DETAILED DESCRIPTION OF THE INVENTION

Figure 1A:
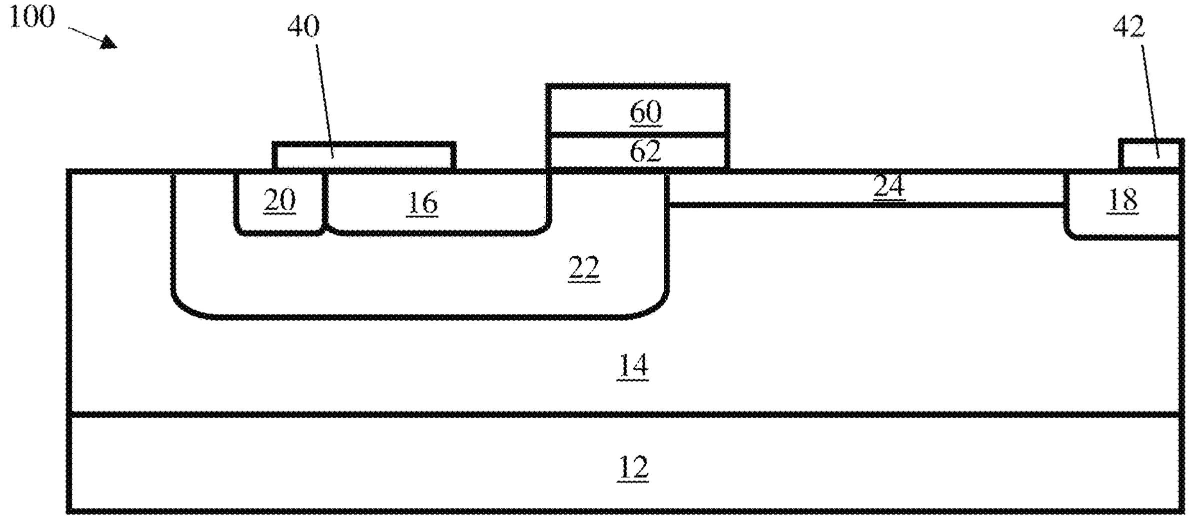
FIG. 1A (Prior Art)
FIGS. 1A and 1B illustrate cross-sectional views of lateral double diffused metal-oxide-semiconductor field-effect transistor (lateral double diffused MOSFET or LDMOS) devices described in the prior art.

Before the present semiconductor power devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms “a”, “an”, and “the” include plural referents unless the context clearly dictates otherwise. Thus, for example, reference to “a cell” includes a plurality of such cells and reference to “the floating body” includes reference to one or more floating bodies and equivalents thereof known to those skilled in the art, and so forth.

The publications discussed herein are provided solely for their disclosure prior to the filing date of the present application. The dates of publication provided may be different from the actual publication dates which may need to be independently confirmed.

Semiconductor power devices are semiconductor devices that allow for high current and high voltage operation. They can block a high voltage when the devices are in the off state, for example 600V or 1200V, and therefore have high junction breakdown voltage. The breakdown voltage of the power devices is much higher compared to the voltage required to turn on the devices. For example, a 1200V device may require a 20V bias to turn on. When the power devices are in the on state, they allow for high current to flow through the devices.

FIG. 1A illustrates a semiconductor power device 100, often referred to as lateral double diffused MOSFET (LDMOS). Power device 100 includes a substrate 12 of a first conductivity type such as p-type, for example. Examples of semiconductor materials used to fabricate power device 100 include silicon, silicon carbide, and gallium oxide but may also comprise other semiconductor materials. Region 14 of a first conductivity type is embedded in the substrate 12. Region 14 is typically more lightly doped compared to substrate 12. Region 14 may be grown epitaxially on top of substrate 12.

Power device 100 also comprises body region 22 having a first conductivity type. Body region 22 is located between source 16 and drain regions, where the drain regions comprise the lightly doped region 24 and the drain region 18. The source region 16, lightly doped region 24, and the drain region 18 are of second conductivity type, such as n-type, for example. The lightly doped region 24 is designed such that power device 100 has a higher breakdown voltage and may operate at higher voltage level, for example, up to 100V. Power device 100 also includes a gate insulating layer 62 and gate region 60.

Figure 1B:
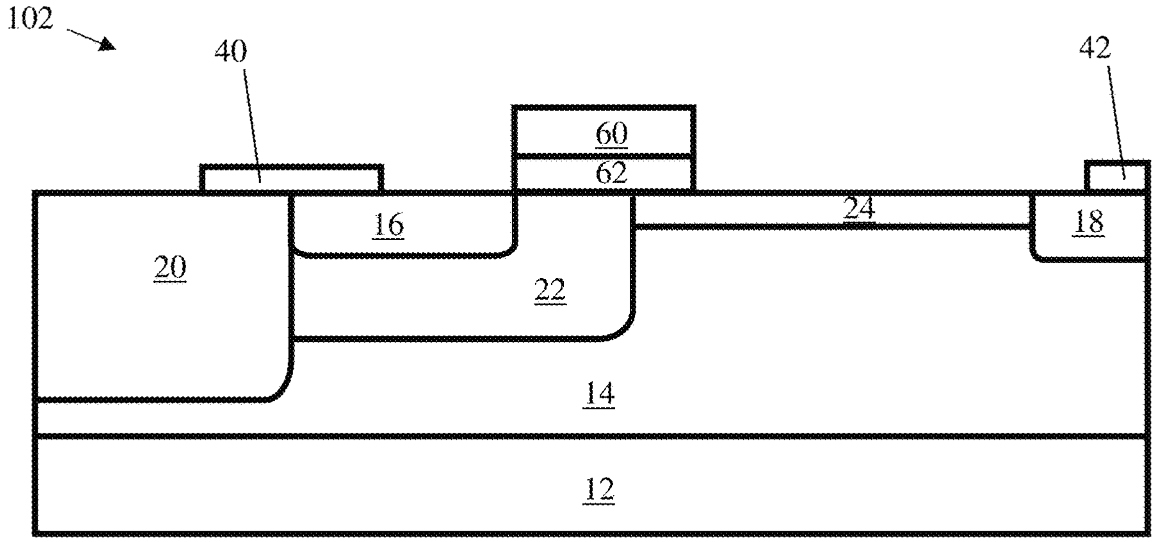
FIG. 1B (Prior Art)

Power device 100 also comprises a body contact region 20 having a first conductivity type. Body contact region 20 is typically more highly doped compared to the body region 22 to lower the contact resistance. To further lower the contact resistance, the body contact region 20 may be made deeper, such as shown for example in FIG. 1B. In prior art semiconductor power devices, the body region 22 and the source region 16 are known to be electrically shorted, for example as described in U.S. Patent App. No. 2011/0294289, “Method for Producing a Connection Electrode for Two Semiconductor Zones Arranged One Above Another”, which is hereby incorporated herein, in its entirety, by reference thereto. This is realized by a source electrode 40, which electrically shorts the body contact region 20 and the source region 16. Power device 100 also comprises a drain electrode 42 to electrically connect to the drain region 18, as well as gate electrode (not shown in FIGS. 1A and 1B) connected to the gate region 60.

Figure 1C:
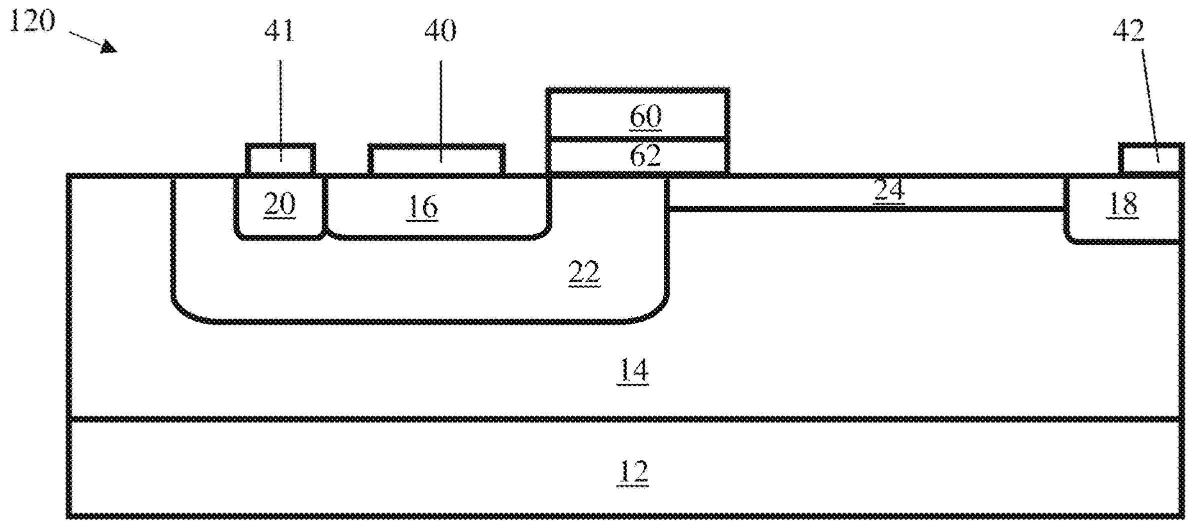
FIG. 1C is a cross-sectional view of an LDMOS device according to an embodiment of the present invention.

FIG. 1C illustrates an LDMOS device 120 according to an embodiment of the present invention. Similar to LDMOS 100, LDMOS 120 includes a substrate 12 of a first conductivity type such as p-type, for example; region 14 of a first conductivity type being more lightly doped compared to substrate 12; body region 22 having a first conductivity type; body contact region 20 having a first conductivity type; source region 16 having a second conductivity type; drain region 18 having a second conductivity type; lightly doped region 24 having a second conductivity type; gate insulating layer 62; and gate region 60.

LDMOS device 120 comprises a drain electrode 42 electrically connected to the drain region 18, a source electrode 40 electrically connected to the source region 16, and a body electrode 41 electrically connected to the body contact region 20. Source electrode 40 and body electrode 41 allows for the body region 22 and source region 16 to be independently controlled.

When LDMOS 120 is in conducting mode, a positive voltage is applied to the gate region 60, a positive voltage is applied to the drain region 18, about zero voltage is applied to the source region 16, and a positive voltage is applied to the body contact region 20. Application of a positive voltage to the body contact region 20 results in a higher current flow (from the drain region 18 to the source region 16) compared to if the body contact region 20 is grounded (for example as in LDMOS 100).

The higher current flow is a result of a lower threshold voltage (Vt) when the body region 22 is positively biased (through the body contact region 20). The effect of the bias to the body region 22 is described by the following equation:

$$V_t = V_{t0} + \left(\gamma\sqrt{|-2\phi_P + V_{SB}|} - \sqrt{|2\phi_P|}\right)$$

where: $V_t$ is the threshold voltage when a body bias is present;

$V_{t0}$ is the threshold voltage with zero bias applied;

$\gamma$ is the body effect coefficient;

$2\phi_P$ is the surface potential; and $V_{SB}$ is the bias applied to the body region 22.

Figure 1D:
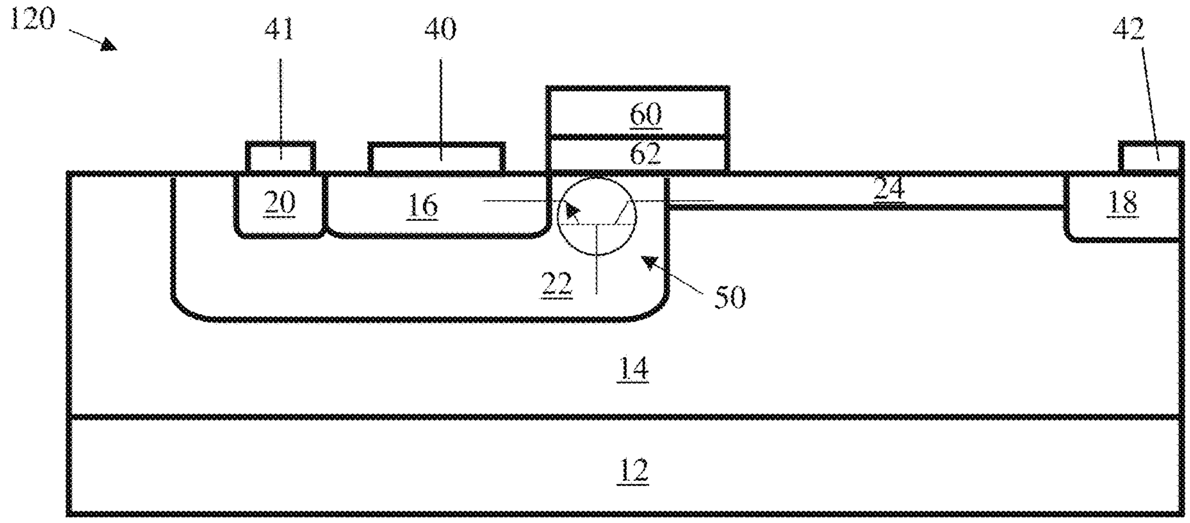
FIG. 1D illustrates an intrinsic lateral bipolar transistor in any of the LDMOS devices shown in FIGS. 1A-1C and 1E.

A positive bias applied to the body region 22 (through the body contact region 20) also turns on the intrinsic lateral bipolar transistor 50 (see FIG. 1D), where the source region 16 functions as the emitter region, the body region 22 functions as the base region, and the lightly doped region 24 and drain region 18 function as the collector region of the bipolar transistor 50. The lateral bipolar transistor 50 also contributes to higher current flow (from the drain region 18 to the source region 16) when the body contact region 20 is positively biased.

When the LDMOS device 120 is turned off, a negative bias may be applied to the body electrode 41. The negative bias applied to the body region 22 (through the body contact region 20) will increase energy barrier between the drain region 18 and the source region 16, hence suppressing punch-through and increasing the breakdown voltage of LDMOS device 120 compared to when the body region 22 is grounded (for example as in LDMOS devices 100 and 102). Application of a negative bias to the body region 22 will also reduce the leakage current (between the drain region 18 and source region 16) when the LDMOS device 120 is turned off (when the gate region 60 is turned off by applying about 0V bias). Furthermore, application of zero or negative bias to the body region 22 may remove charge in the body region 22, and therefore improve the switch-off time of the LDMOS device 120. A negative bias may also be applied to the gate region 60 in conjunction with the negative bias application to the body region 22.

The applied bias to the body region 22 has been described as voltage bias, i.e. positive voltage bias when the LDMOS device 120 is turned on and zero or negative voltage bias when the LDMOS device 120 is turned off. However, a current bias may also be applied to the body region 22, i.e. positive current bias when the LDMOS device 120 is turned on and zero or negative current bias when the LDMOS device 120 is turned off.

Figure 1E:
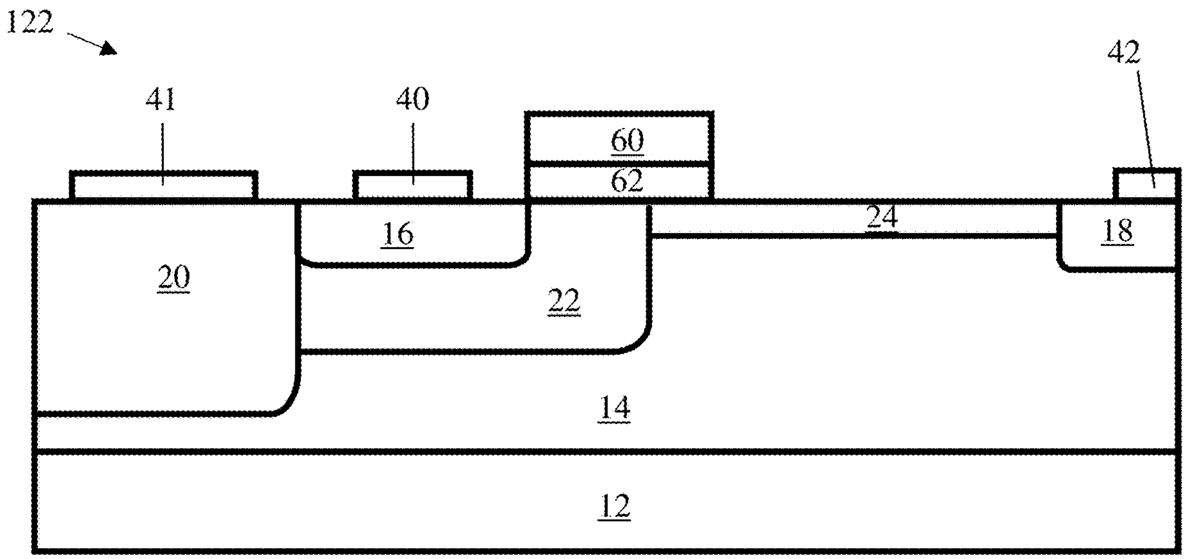
FIG. 1E is a cross-sectional view of an LDMOS device according to an embodiment of the present invention.

FIG. 1E illustrates an LDMOS device 122, where the contact resistance to the body region 22 in the LDMOS device can be lowered by having a deeper body contact region 20.

Figure 2:
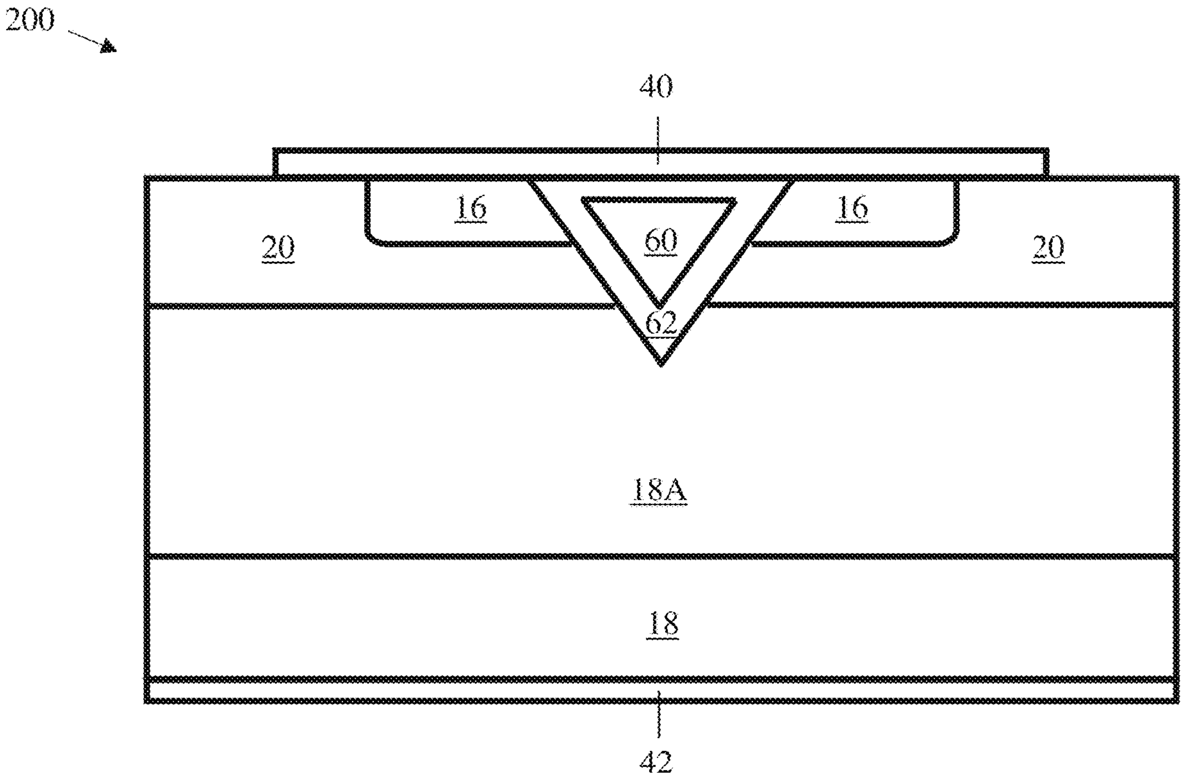
FIG. 2 (Prior Art)
FIG. 2 illustrates a cross-sectional view of a vertical channel semiconductor power (VMOS) device described in the prior art.

FIG. 2 illustrates a vertical channel semiconductor power device 200, often referred to as a VMOS. Power device 200 includes a substrate 18 of a second conductivity type such as n-type, for example. Examples of semiconductor materials used to fabricate power device 200 include silicon, silicon carbide, and gallium oxide but may also comprise other semiconductor materials. Drift region 18A of a second conductivity type is embedded in the substrate 18. Drift region 18A is typically more lightly doped compared to the substrate 18.

Power device 200 also comprises base region 20 having a first conductivity type, such as p-type, for example. Power device 200 further comprises source region 16 having a second conductivity type. Power device 200 also comprises of a gate insulating layer 62 and gate region 60, which are formed inside a V-shaped groove, cutting the source region 16, base region 20 into the drift region 18A. A source electrode 40 electrically shorts the base region 20 and the source region 16, while a drain electrode 42 is electrically connected to the bottom of the substrate region 18. Power device 200 is a vertical channel device, where current flows from the drain electrode 42 to the source electrode 40 in the conducting state. When the power device is turned on by applying a positive voltage to the gate region 60, the base region 20 underneath the gate insulating layer 62 is inverted, forming a channel region connecting the source region 16 and the drift region 18A.

Figure 3:
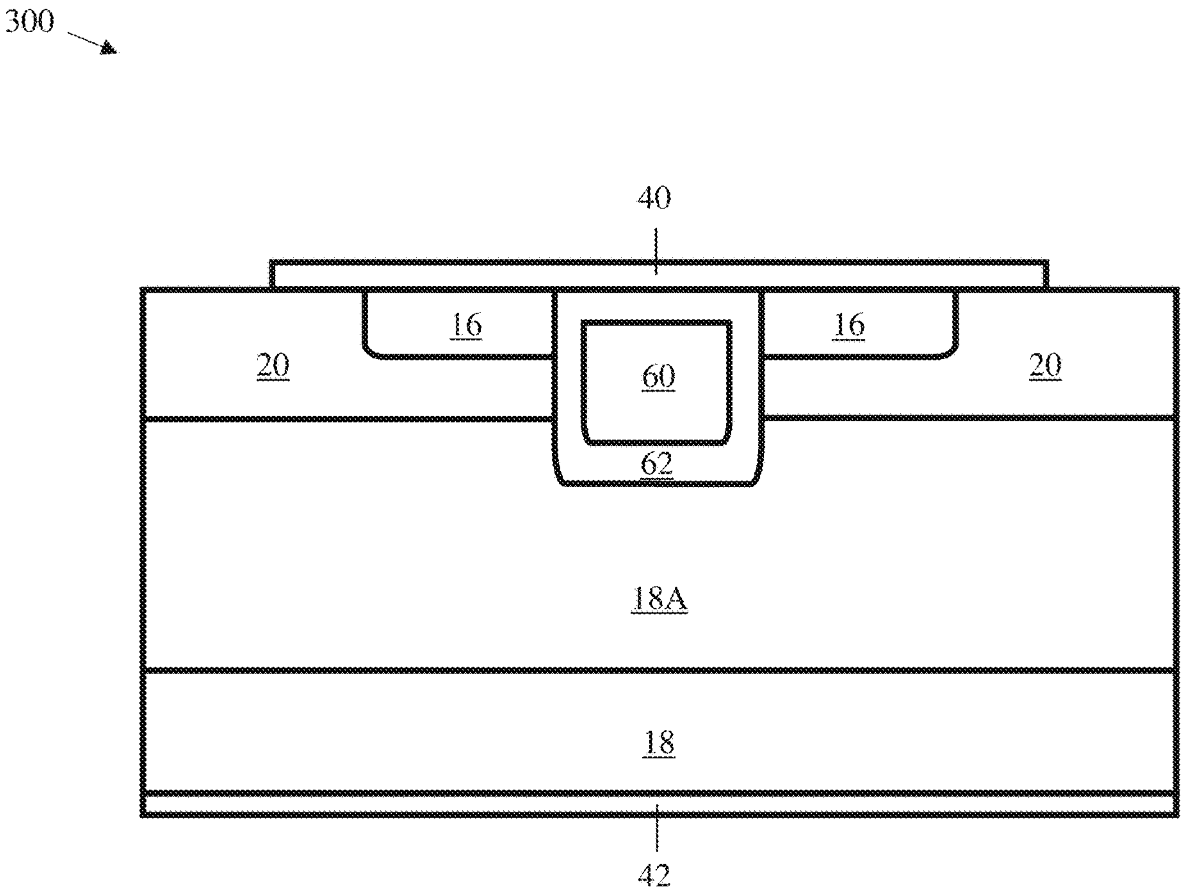
FIG. 3 (Prior Art)
FIG. 3 illustrates a cross-sectional view of a vertical channel semiconductor power (UMOS) device described in the prior art.

FIG. 3 illustrates a vertical channel semiconductor power device 300, often referred to as UMOS or trench MOS. In power device 300, the gate insulating layer 62 and gate region 60 are formed in a U-shaped trench, where the bottom corners of the trench are more rounded compared to the sharp corner of the V-shaped groove of VMOS 200. Power device 300 is a vertical channel device, where current flows from the drain electrode 42 to the source electrode 40 in the conducting state. When the power device 300 is turned on by applying a positive voltage to the gate region 60, the base region 20 underneath the gate insulating layer 62 is inverted, forming a channel region connecting the source region 16 and the drift region 18A.

Figure 4:
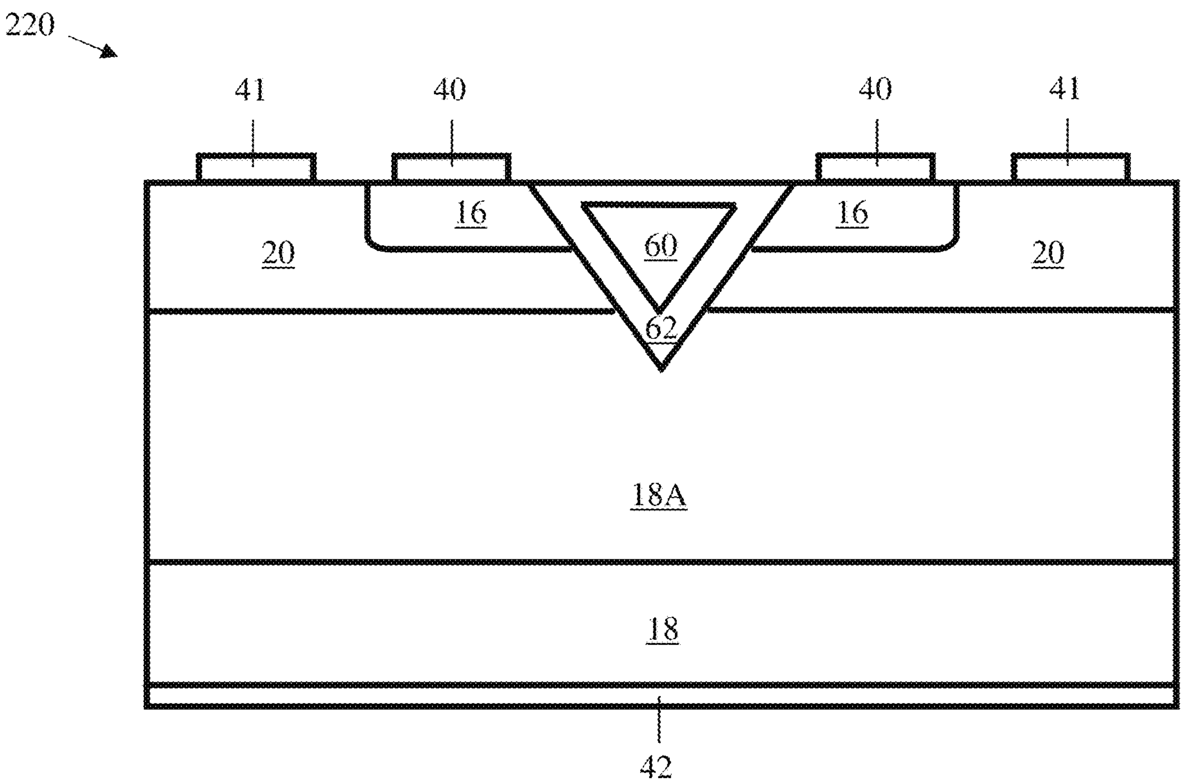
FIG. 4 illustrates a cross-sectional view of a VMOS device according to another embodiment of the present invention.

FIG. 4 illustrates a VMOS device 220, where the body region 20 and source region 16 can be independently controlled through a body electrode 41 and source electrode 40, respectively. The body electrode 41 is electrically connected to the body region 20 and source electrode 40 is electrically connected to the source region 16.

When VMOS 220 is in conducting mode, a positive voltage is applied to the gate region 60, a positive voltage is applied to the drain region 18, about zero voltage is applied to the source region 16, and a positive voltage is applied to the body contact region 20. Application of a positive voltage to the body contact region 20 results in a higher current flow (from the drain region 18 to the source region 16) compared to if the body region 20 is grounded (for example as in VMOS 200).

When the VMOS device 220 is turned off, a negative bias may be applied to the body electrode 41. The negative bias applied to the body region 20 (through the body electrode 41) will increase energy barrier between the drain region 18 and the source region 16, hence suppressing punch-through and increasing the breakdown voltage of VMOS device 220 compared to when the body region 20 is grounded (for example as in VMOS device 200). Application of a negative bias to the body region 20 will also reduce the leakage current (between the drain region 18 and source region 16) when the VMOS device 220 is turned off (when the gate region 60 is turned off by applying about 0V bias). Furthermore, application of zero or negative bias to the body region 20 may remove charge in the body region 20, and therefore improve the switch-off time of the VMOS device 220. A negative bias may also be applied to the gate region 60 in conjunction with the negative bias application to the body region 20.

The applied bias to the body region 20 has been described as voltage bias. However, a current bias may also be applied to the body region 20, i.e. positive current bias when the VMOS device 220 is turned on and zero or negative current bias when the VMOS device 220 is turned off.

Figure 5:
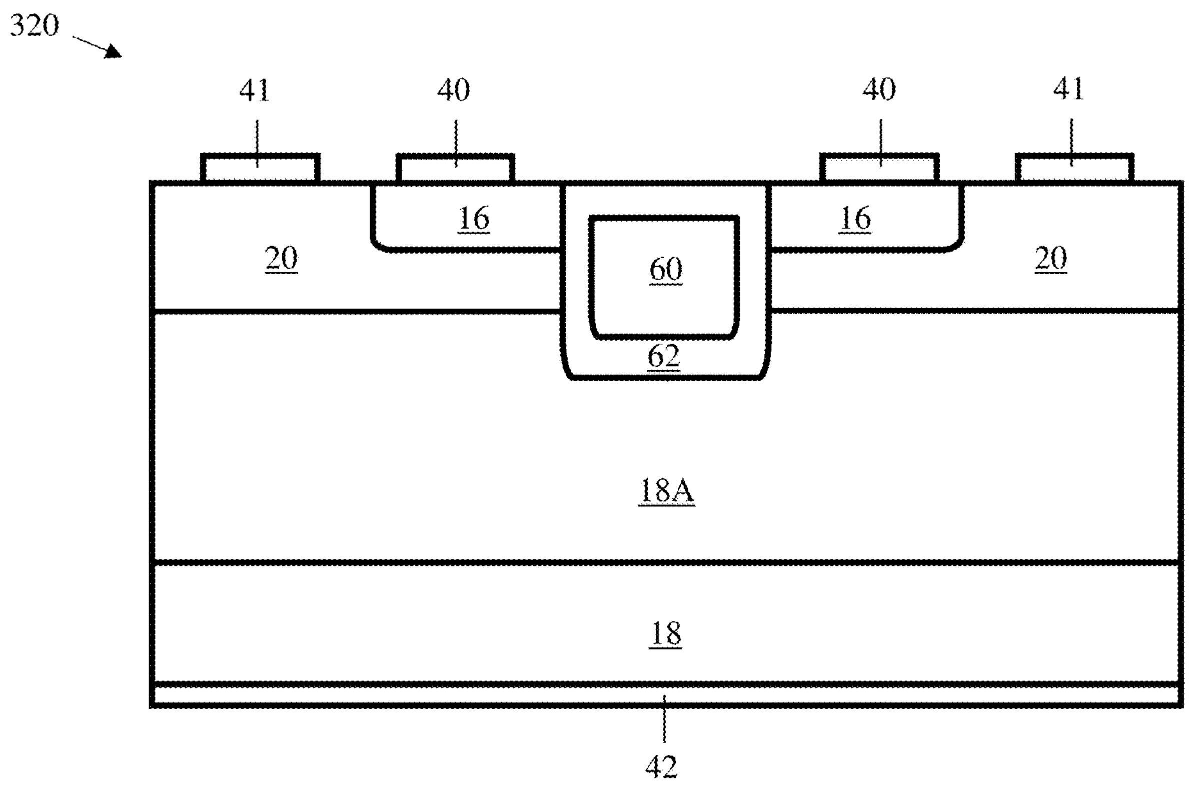
FIG. 5 illustrates a cross-sectional view of a UMOS device according to another embodiment of the present invention.

FIG. 5 illustrates a UMOS device 320, where the body region 20 and source region 16 can be independently controlled through a body electrode 41 and source electrode 40, respectively. The body electrode 41 is electrically connected to the body region 20 and source electrode 40 is electrically connected to the source region 16.

When UMOS 320 is in conducting mode, a positive voltage is applied to the gate region 60, a positive voltage is applied to the drain region 18, about zero voltage is applied to the source region 16, and a positive voltage is applied to the body contact region 20. Application of a positive voltage to the body contact region 20 results in a higher current flow (from the drain region 18 to the source region 16) compared to if the body region 20 is grounded (for example as in UMOS 300).

When the UMOS device 320 is turned off, a negative bias may be applied to the body electrode 41. The negative bias applied to the body region 20 (through the body electrode 41) will increase an energy barrier between the drain region 18 and the source region 16, hence suppressing punch-through and increasing the breakdown voltage of UMOS device 320 compared to when the body region 20 is grounded (for example as in UMOS device 300). Application of a negative bias to the body region 20 will also reduce the leakage current (between the drain region 18 and source region 16) when the UMOS device 320 is turned off (when the gate region 60 is turned off by applying about 0V bias). Furthermore, application of zero or negative bias to the body region 20 may remove charge in the body region 20, and therefore improve the switch-off time of the UMOS device 320. A negative bias may also be applied to the gate region 60 in conjunction with the negative bias application to the body region 20.

The applied bias to the body region 20 has been described as voltage bias. However, a current bias may also be applied to the body region 20, i.e. positive current bias when the UMOS device 320 is turned on and zero or negative current bias when the UMOS device 320 is turned off.

Figure 6:
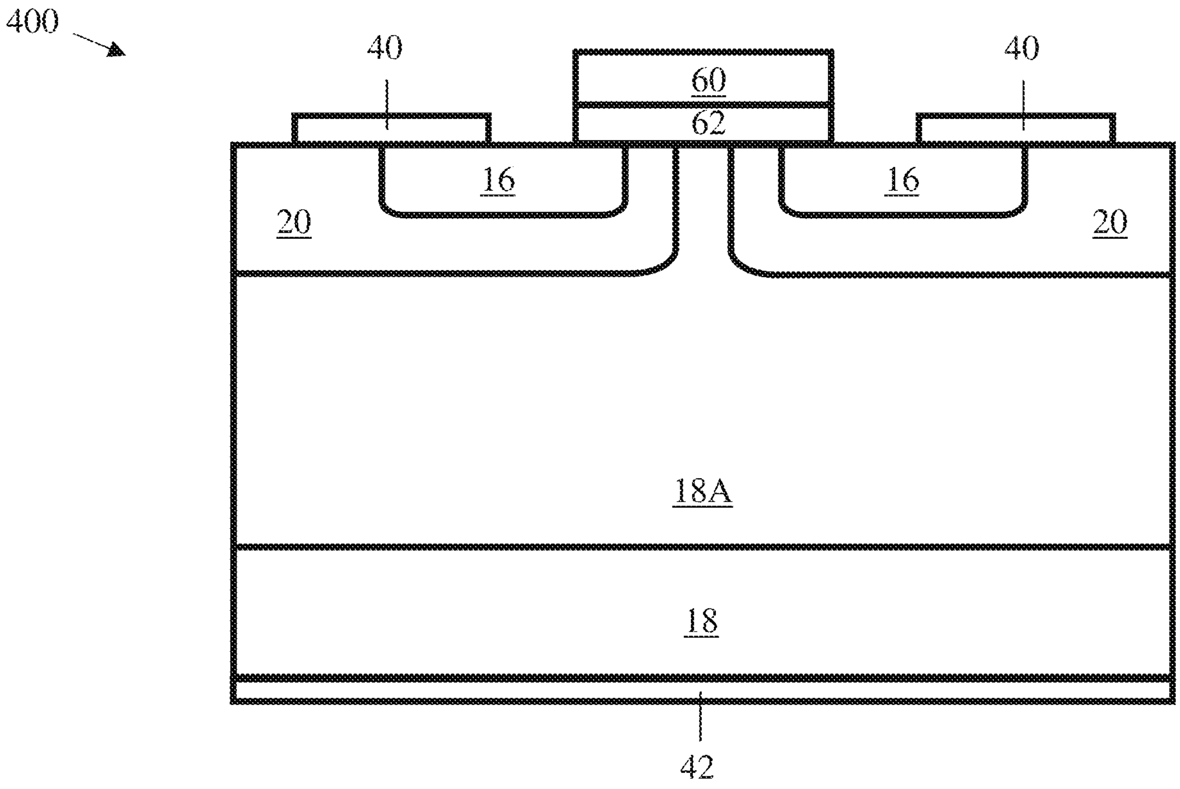
FIG. 6 (Prior Art)
FIG. 6 illustrates a cross-sectional view of a vertical diffused metal-oxide-semiconductor (vertical diffused MOS or VDMOS) device described in the prior art.

FIG. 6 illustrates a vertical channel semiconductor power device 400, often referred to as vertical diffused MOS (VDMOS). Power device 400 includes a substrate 18 of a second conductivity type such as n-type, for example. Examples of semiconductor materials used to fabricate power device 400 include silicon, silicon carbide, and gallium oxide but may also comprise other semiconductor materials. Drift region 18A of a second conductivity type is embedded in the substrate 18. Drift region 18A is typically more lightly doped compared to the substrate 18.

Power device 400 also comprises base region 20 having a first conductivity type, such as p-type, for example. Power device 400 further comprises source region 16 having a second conductivity type. Power device 400 also comprises of a gate insulating layer 62 and gate region 60 located above the drift region 18A and overlays a portion of the body region 20. A source electrode 40 electrically shorts the base region 20 and the source region 16, while a drain electrode 42 is electrically connected to the bottom of the substrate region 18. Power device 400 is a vertical channel device, where current flow from the drain electrode 42 to the source electrode 40 in the conducting state. When the power device is turned on by applying a positive voltage to the gate region 60, the base region 20 underneath the gate insulating layer 62 is inverted, forming a channel region connecting the source region 16 and the drift region 18A.

Figure 7:
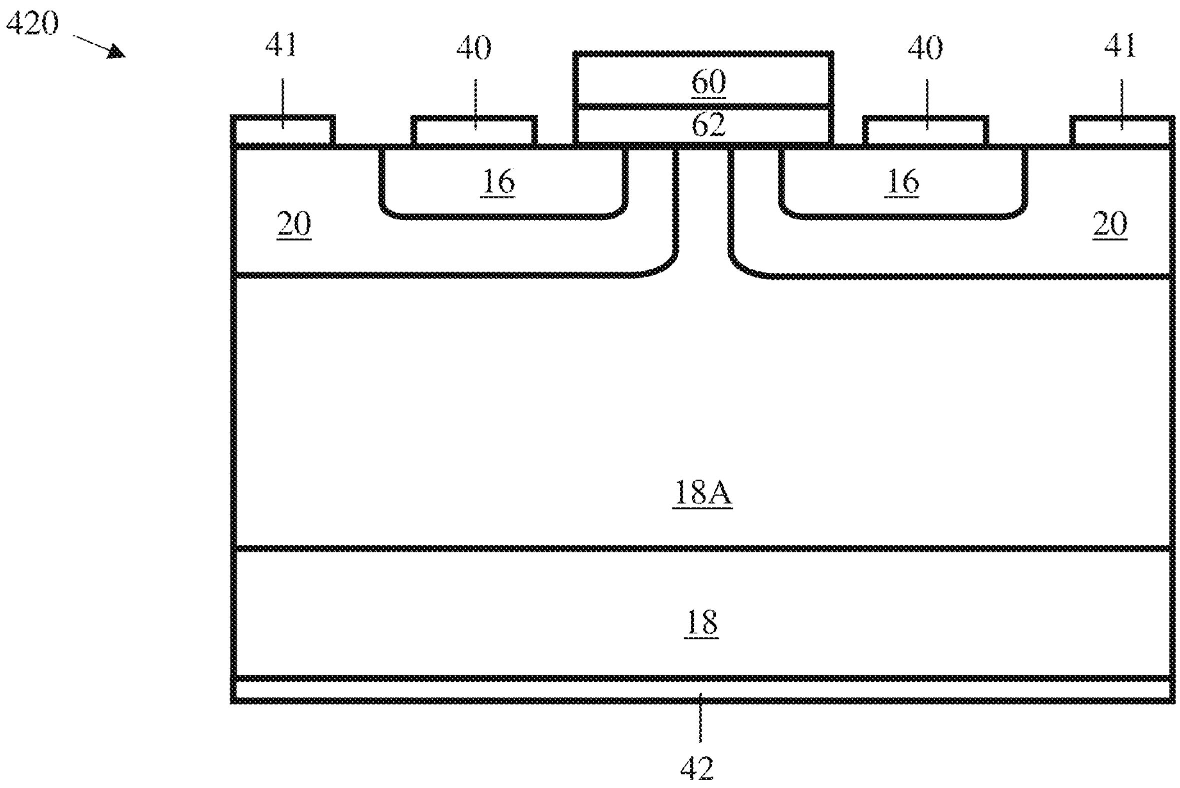
FIG. 7 illustrates a cross-sectional view of a VDMOS device according to another embodiment of the present invention.

FIG. 7 illustrates a VDMOS device 420, where the body region 20 and source region 16 can be independently controlled through a body electrode 41 and source electrode 40, respectively. The body electrode 41 is electrically connected to the body region 20 and source electrode 40 is electrically connected to the source region 16.

When VDMOS 420 is in conducting mode, a positive voltage is applied to the gate region 60, a positive voltage is applied to the drain region 18, about zero voltage is applied to the source region 16, and a positive voltage is applied to the body contact region 20. Application of a positive voltage to the body contact region 20 results in a higher current flow (from the drain region 18 to the source region 16) compared to if the body region 20 is grounded (for example as in VDMOS 400).

When the VDMOS device 420 is turned off, a negative bias may be applied to the body electrode 41. The negative bias applied to the body region 20 (through the body electrode 41) will increase an energy barrier between the drain region 18 and the source region 16, hence suppressing punch-through and increasing the breakdown voltage of VDMOS device 420 compared to when the body region 20 is grounded (for example as in VDMOS device 400). Application of a negative bias to the body region 20 will also reduce the leakage current (between the drain region 18 and source region 16) when the VDMOS device 420 is turned off (when the gate region 60 is turned off by applying about 0V bias). Furthermore, application of zero or negative bias to the body region 20 may remove charge in the body region 20, and therefore improve the switch-off time of the VDMOS device 420. A negative bias may also be applied to the gate region 60 in conjunction with the negative bias application to the body region 20.

The applied bias to the body region 20 has been described as voltage bias. However, a current bias may also be applied to the body region 20, i.e. positive current bias when the VDMOS device 420 is turned on and zero or negative current bias when the VDMOS device 420 is turned off.

Figure 8:
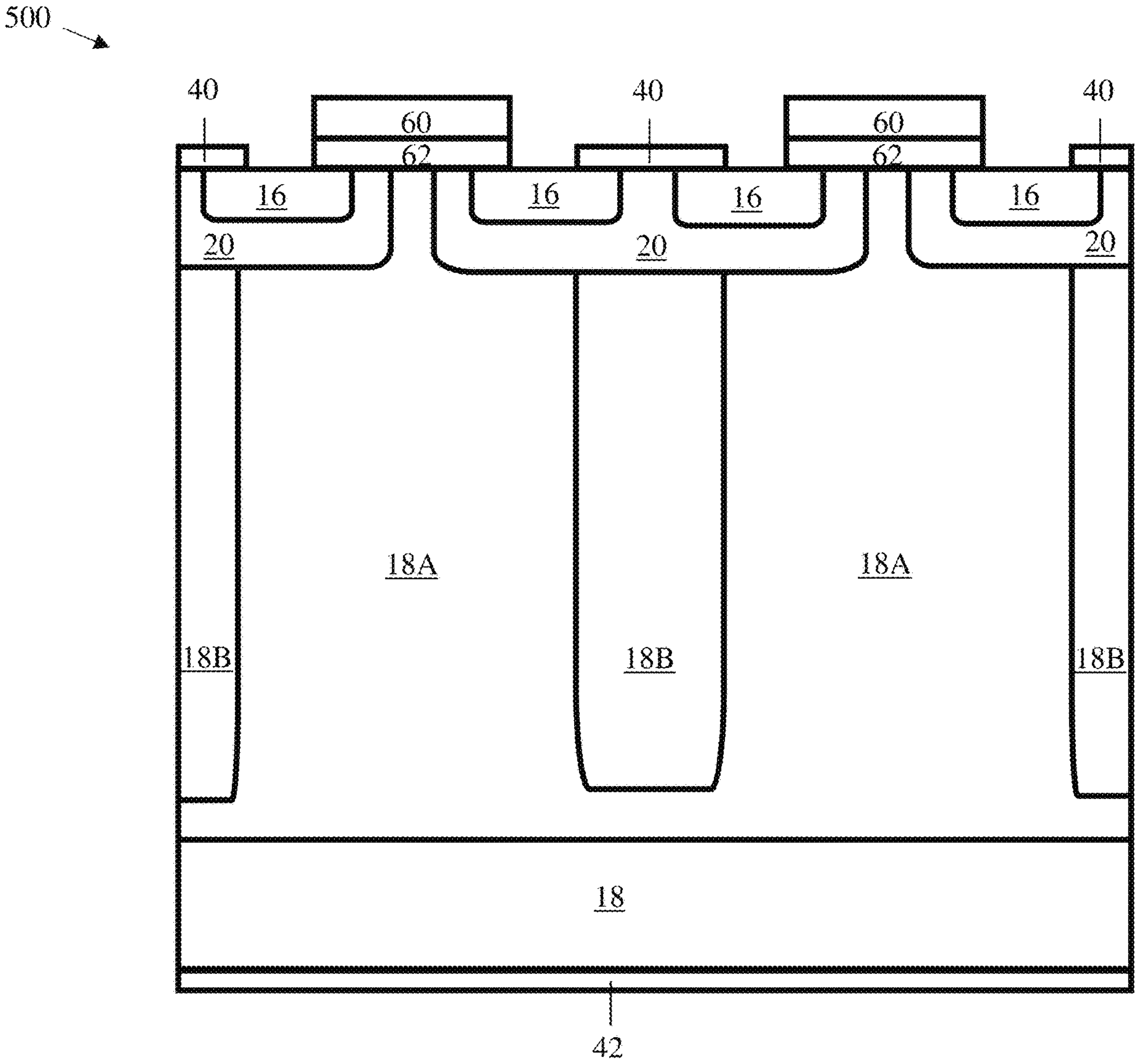
FIG. 8 (Prior Art)
FIG. 8 illustrates a cross-sectional view of a super-junction vertical power device described in the prior art.

FIG. 8 illustrates a super-junction vertical channel semiconductor power device 500. Power device 500 includes a substrate 18 of a second conductivity type such as n-type, for example. Examples of semiconductor materials used to fabricate power device 500 include silicon, silicon carbide, and gallium oxide but may also comprise other semiconductor materials. Drift region 18A of a second conductivity type is embedded in the substrate 18. Drift region 18A is typically more lightly doped compared to the substrate 18. Power device 500 also includes vertical region 18B having a first conductivity type such as p-type, for example. This results in alternating columns having first conductivity type 18B and columns having second conductivity type 18A.

Power device 500 also includes base region 20 having a first conductivity type located above vertical region having first conductivity type 18B. Power device 500 further includes source region 16 having a second conductivity type. Power device 500 also includes a gate insulating layer 62 and gate region 60 located above the drift region 18A and overlays a portion of the body region 20. A source electrode 40 electrically shorts the base region 20 and the source region 16, while a drain electrode 42 is electrically connected to the bottom of the substrate region 18. Power device 500 is a vertical channel device, where current flows from the drain electrode 42 to the source electrode 40 in the conducting state. When the power device 500 is turned on by applying a positive voltage to the gate region 60, the base region 20 underneath the gate insulating layer 62 is inverted, forming a channel region connecting the source region 16 and the drift region 18A.

Figure 9:
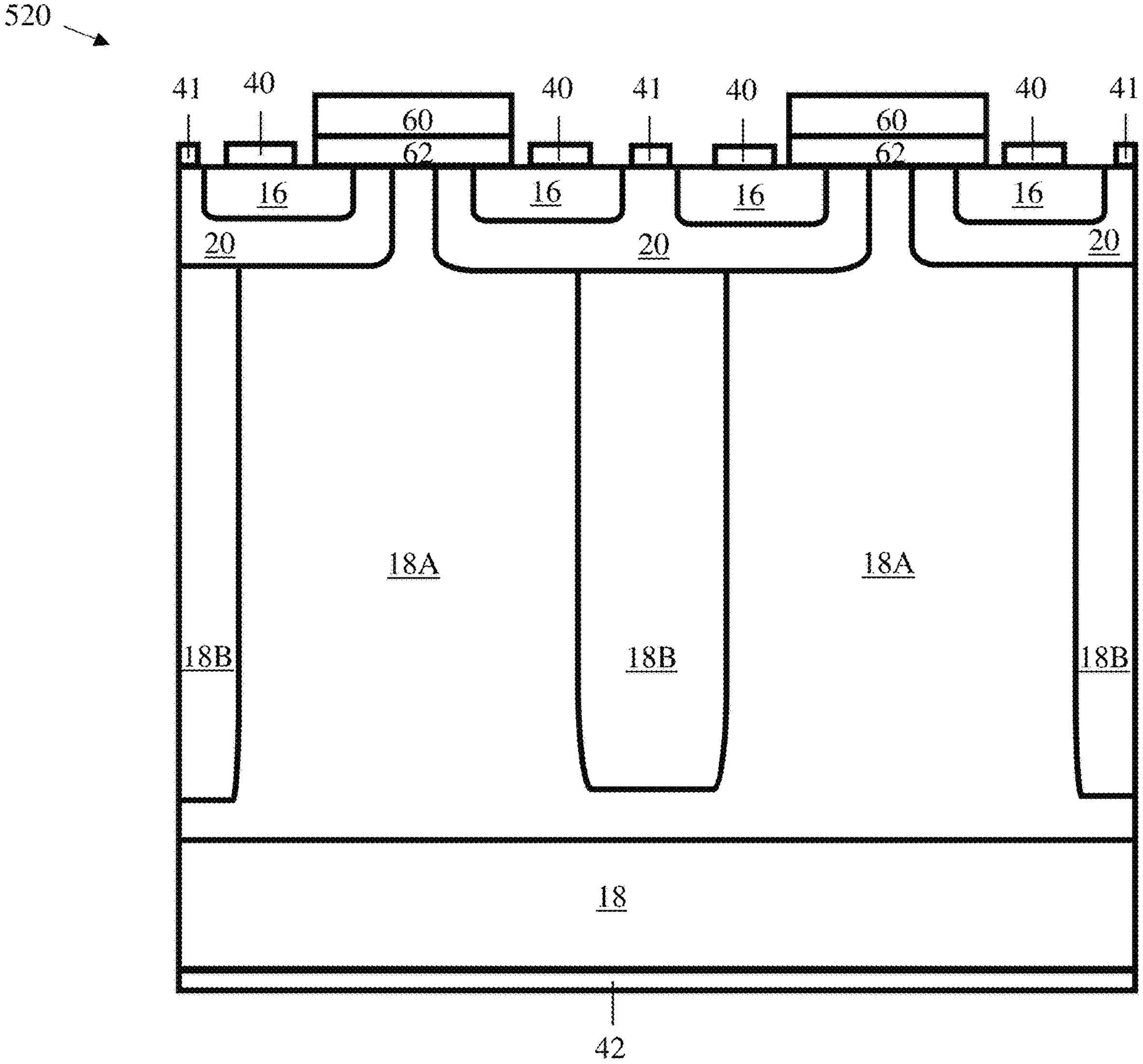
FIG. 9 illustrates a cross-sectional view of a super-junction vertical power device according to another embodiment of the present invention.

FIG. 9 illustrates a super-junction vertical channel semiconductor power device 520, where the body region 20 and source region 16 can be independently controlled through a body electrode 41 and source electrode 40, respectively. The body electrode 41 is electrically connected to the body region 20 and source electrode 40 is electrically connected to the source region 16.

When super-junction power device 520 is in conducting mode, a positive voltage is applied to the gate region 60, a positive voltage is applied to the drain region 18, about zero voltage is applied to the source region 16, and a positive voltage is applied to the body contact region 20. Application of a positive voltage to the body contact region 20 results in a higher current flow (from the drain region 18 to the source region 16) compared to if the body region 20 is grounded (for example as in super-junction power device 500).

When the super-junction power device 520 is turned off, a negative bias may be applied to the body electrode 41. The negative bias applied to the body region 20 (through the body electrode 41) will increase an energy barrier between the drain region 18 and the source region 16, hence suppressing punch-through and increasing the breakdown voltage of super-junction power device 520 compared to when the body region 20 is grounded (for example as in super-junction power device 500). Application of a negative bias to the body region 20 will also reduce the leakage current (between the drain region 18 and source region 16) when the super-junction power device 520 is turned off (when the gate region 60 is turned off by applying about 0V bias). Furthermore, application of zero or negative bias to the body region 20 may remove charge in the body region 20, and therefore improve the switch-off time of the super-junction power device 520. A negative bias may also be applied to the gate region 60 in addition to the negative bias application to the body region 20.

The applied bias to the body region 20 has been described as voltage bias. However, a current bias may also be applied to the body region 20, i.e. positive current bias when the super-junction power device 520 is turned on and zero or negative current bias when the super-junction power device 520 is turned off.

A super-junction power device may also be fabricated laterally, having alternating rows of first conductivity type 18B and rows of second conductivity type 18A. Independent control of body region 20 and source region 16 can also be implemented in lateral super-junction power device as well, which allows for lower on-resistance and higher breakdown voltage.

Figure 10:
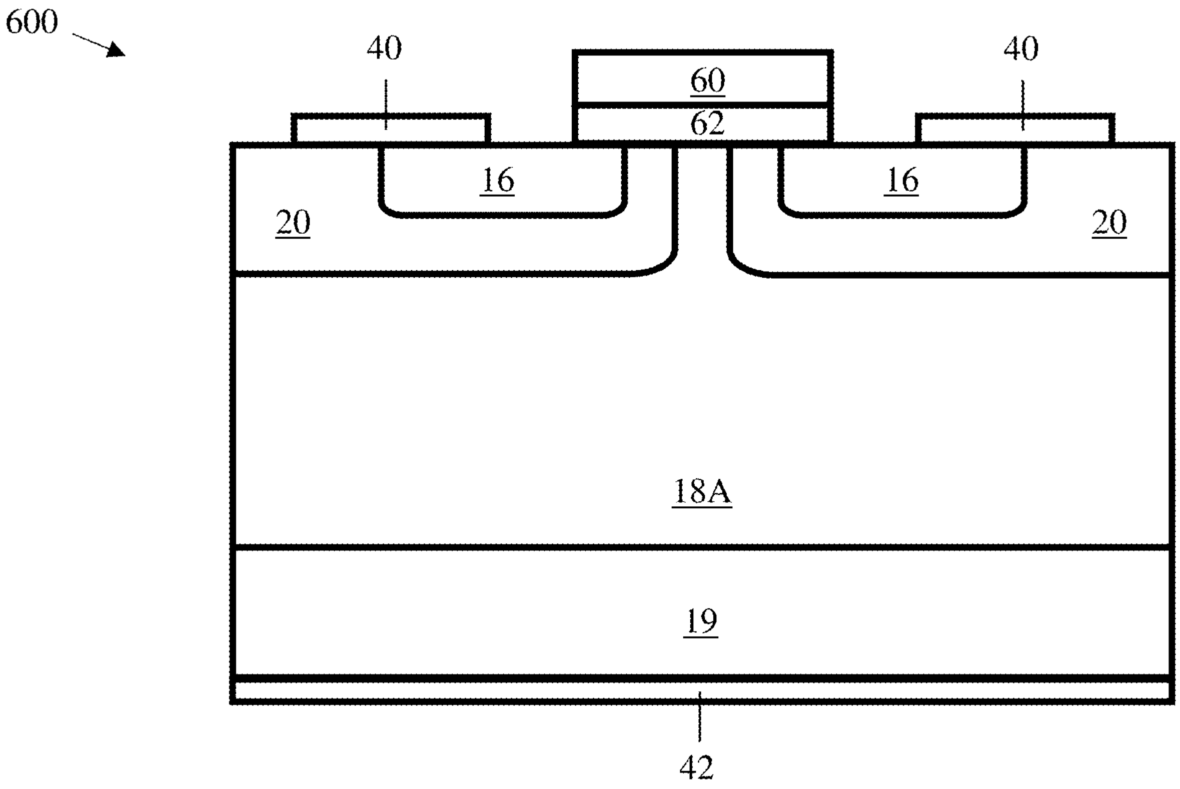
FIG. 10 (Prior Art)
FIG. 10 illustrates a cross-sectional view of an insulated-gate bipolar transistor (IGBT) device described in the prior art.

FIG. 10 illustrates a semiconductor power device 600, often referred to as insulated-gate bipolar transistor (IGBT). Power device 600 includes a substrate 19 of a first conductivity type, such as p-type, for example. Examples of semiconductor materials used to fabricate power device 600 include silicon, silicon carbide, and gallium oxide but may also comprise other semiconductor materials. Drift region 18A of a second conductivity type, such as n-type, for example is embedded in the substrate 19.

Power device 600 also comprises base region 20 having a first conductivity type, such as p-type, for example. Power device 600 further comprises emitter region 16 having a second conductivity type. Power device 600 also includes a gate insulating layer 62 and gate region 60 located above the drift region 18A and overlaying a portion of the base region 20. An emitter electrode 40 electrically shorts the base region 20 and the emitter region 16, while a collector electrode 42 is electrically connected to the bottom of the substrate region 19. Power device 600 is a vertical channel device, where current flow from the collector electrode 42 to the emitter electrode 40 in the conducting state. When the power device is turned on by applying a positive voltage to the gate region 60, the base region 20 underneath the gate insulating layer 62 is inverted, forming a channel region connecting the emitter region 16 and the drift region 18A.

Figure 11:
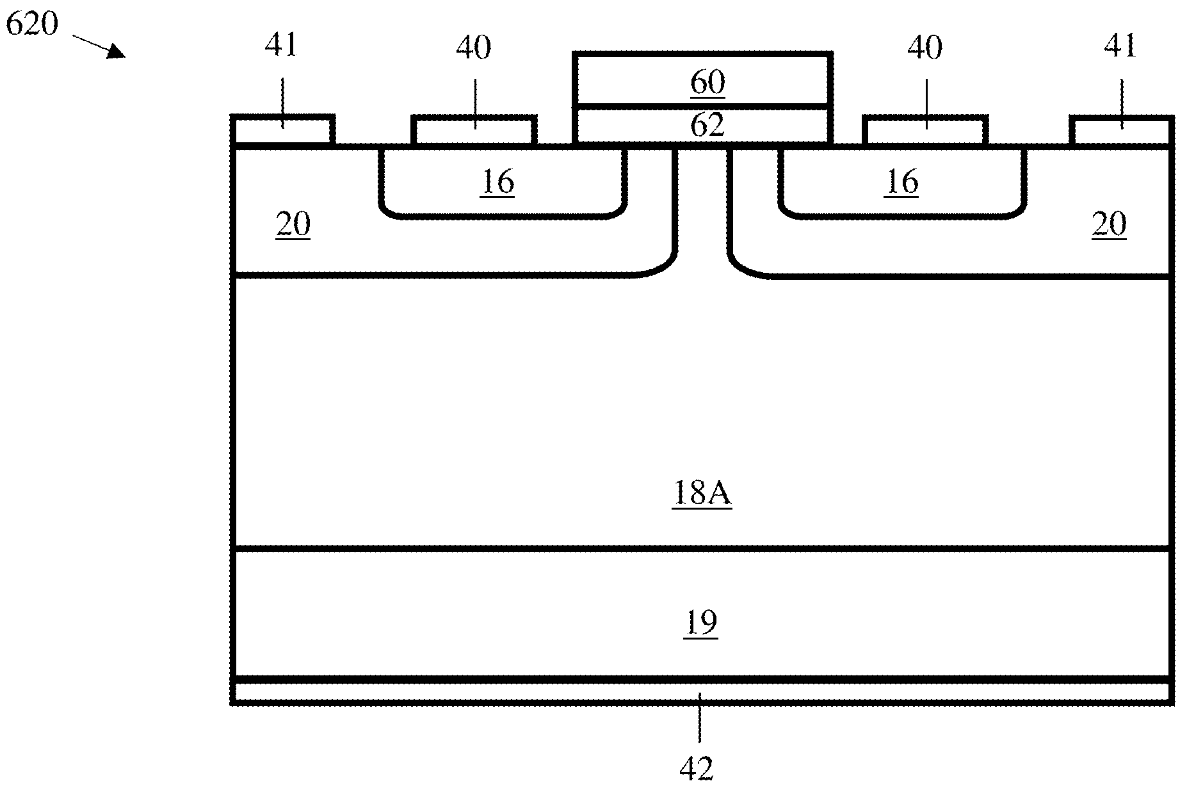
FIG. 11 illustrates a cross-sectional view of an IGBT device according to another embodiment of the present invention.

FIG. 11 illustrates IGBT 620, where the base region 20 and emitter region 16 can be independently controlled through a body electrode 41 and emitter electrode 40, respectively. The body electrode 41 is electrically connected to the base region 20 and emitter electrode 40 is electrically connected to the emitter region 16.

When IGBT 620 is in conducting mode, a positive voltage is applied to the gate region 60, a positive voltage is applied to the substrate 19, about zero voltage is applied to the emitter region 16, and a positive voltage is applied to the base region 20. Application of a positive voltage to the base region 20 results in a higher current flow (from the substrate 19 to the emitter region 16) compared to if the base region 20 is grounded (for example as in IGBT 600).

When the IGBT 620 is turned off, a negative bias may be applied to the body electrode 41. The negative bias applied to the base region 20 (through the body electrode 41) will increase an energy barrier between the drift region 18A and the emitter region 16, hence suppressing punch-through and increasing the breakdown voltage of IGBT 620 compared to when the base region 20 is grounded (for example as in IGBT 600). Application of a negative bias to the base region 20 will also reduce the leakage current (between the substrate 19 and emitter region 16) when the IGBT 620 is turned off (when the gate region 60 is turned off by applying about 0V bias). Furthermore, application of zero or negative bias to the base region 20 may remove charge in the base region 20, and therefore improve the switch-off time of the IGBT device 620. A negative bias may also be applied to the gate region 60 in conjunction with the negative bias application to the base region 20.

Application of negative bias to the base region 20 of the IGBT 620 also improves the latch-up immunity of the IGBT 620 device as the potential of the base region 20 can be limited below the latch-up condition of the thyristor device formed by substrate 19, drift region 18A, base region 20, and the emitter region 16.

The applied bias to the base region 20 has been described as voltage bias. However, a current bias may also be applied to the base region 20, i.e. positive current bias when the IGBT device 620 is turned on and zero or negative current bias when the IGBT device 620 is turned off.

Figure 12:
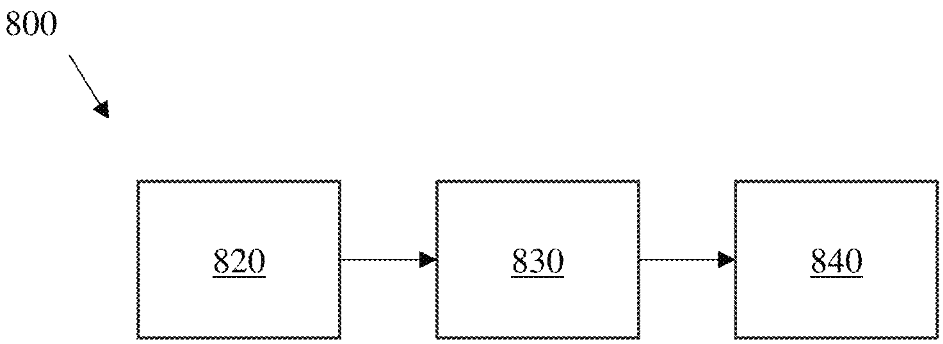
FIG. 12 schematically illustrates a system comprising a semiconductor power device.

FIG. 12 illustrates a schematic of a system 800 comprising power devices 840. Power devices 840 can be any of the power devices, including but not limited to LDMOS devices 120 and 122, VMOS device 220, UMOS device 320, VDMOS device 420, super-junction device 520, and IGBT 620. Power system 800 also includes control circuit 820, which provides input to a driver circuitry 830. Driver circuitry 830 generates the necessary voltage or current signals to operate the power devices 840, including but not limited to signals, voltage levels, current levels for the gate electrode/region, source electrode, drain electrode, and the body electrode. Control circuit 820, driver circuitry 830, and power devices 840 may be in the form of separate components which are then integrated to form power system 800 module. Power system 800 may also comprise other components, for example passive components such as resistors, capacitors, and inductors, and/or additional circuits for energy harvesting. In another embodiment of the present invention, control circuit 820, driver circuitry 830, and power devices 840 may be in the form of separate semiconductor die, which are then integrated into a single package. Alternatively, control circuit 820, driver circuitry 830, and power devices 840 may be an integrated chip.

Figure 13:
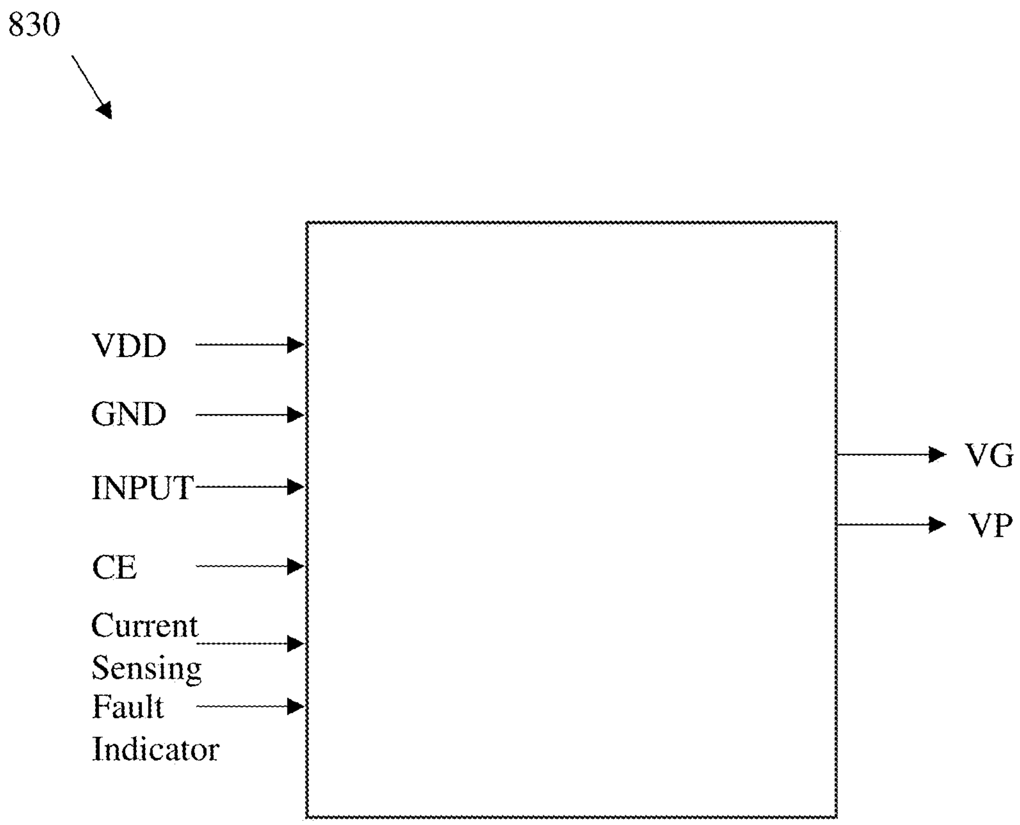
FIG. 13 schematically illustrates a block diagram of a driver circuitry according to an embodiment of the present invention.

FIG. 13 shows an exemplary block diagram of driver circuitry 830. VDD and GND provide the supply voltage for the driver circuitry 830. INPUT signal provides the instructions to turn on or off the power devices 840, by providing the output signals VG and VP. CE signal can be used to control the timing or adjust the duty cycle of the power devices 840. Driver circuitry 830 may also have additional control signals to control the timing, such as the pulse width, time delay and the slew rate, of the VG and VP output signals. Alternatively, driver circuitry 830 may comprise programmable bits that can be used for the timing control. Driver circuitry 830 may also sense current flow through (or voltage drop across) the power devices 840 or current flow through the driver circuitry 830. This could be used to adjust the output signals VG and VP. The current sensing may also be used to detect failure conditions. For example, if the current flow through the power devices 840 or driver circuitry 830 is above the Fault Indicator threshold, then driver circuitry 830 will adjust the VG and VP output signals to turn off the power devices 840.

Driver circuitry 830 generates output signals VG and VP, which can be independently controlled. The output signal VP has a higher drive current capability than the output signal VG. The output signals VG and VP can be used to drive the gate region 60 and the body electrode 41 of any of the power devices, including but not limited to LDMOS devices 120 and 122, VMOS device 220, UMOS device 320, VDMOS device 420, super-junction device 520, and IGBT 620. In another alternate embodiment of the present invention, the VG signal can be used to drive the gate region 60 of power devices without body electrode 41, for example the LDMOS devices 100 and 102, VMOS device 200, UMOS device 300, VDMOS device 400, super-junction device 500, and IGBT 600, while the VP signal can be used to drive the base terminal of a bipolar device, for example as described in "Modern Semiconductor Devices for Integrated Circuits", C. Hu, which is hereby incorporated herein, in its entirety, by reference thereto.

Output signals' VG and VP signal polarity may be positive or negative. As described above, application of a positive VG and/or VP bias may increase the conductivity of the power devices 840. Similarly, application of a negative VG and/or VP bias may increase the breakdown voltage and improve the switch-off time of power devices 840. The waveforms of VG and VP signals may be controlled to optimize the switching time and energy of the power devices 840.

Figure 14A:
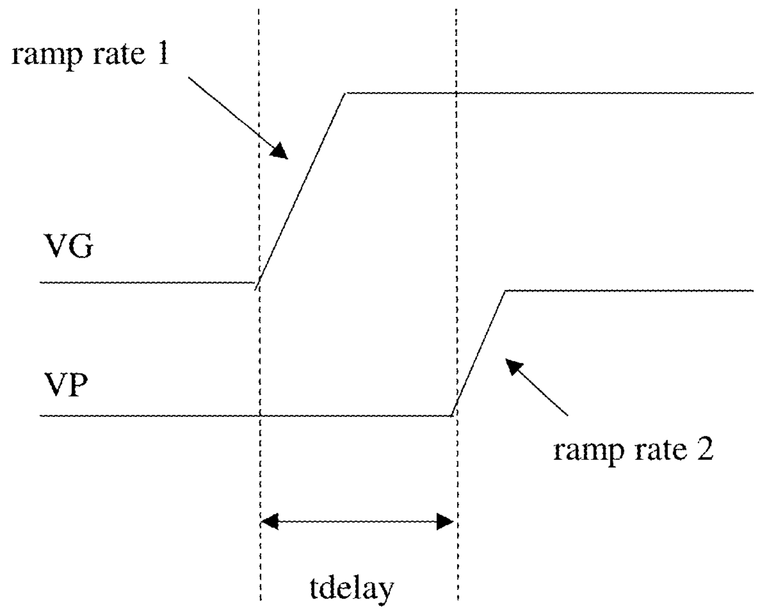
FIGS. 14A and 14B schematically illustrate output signals generated to turn on semiconductor power devices according to an embodiment of the present invention.
Figure 14B:
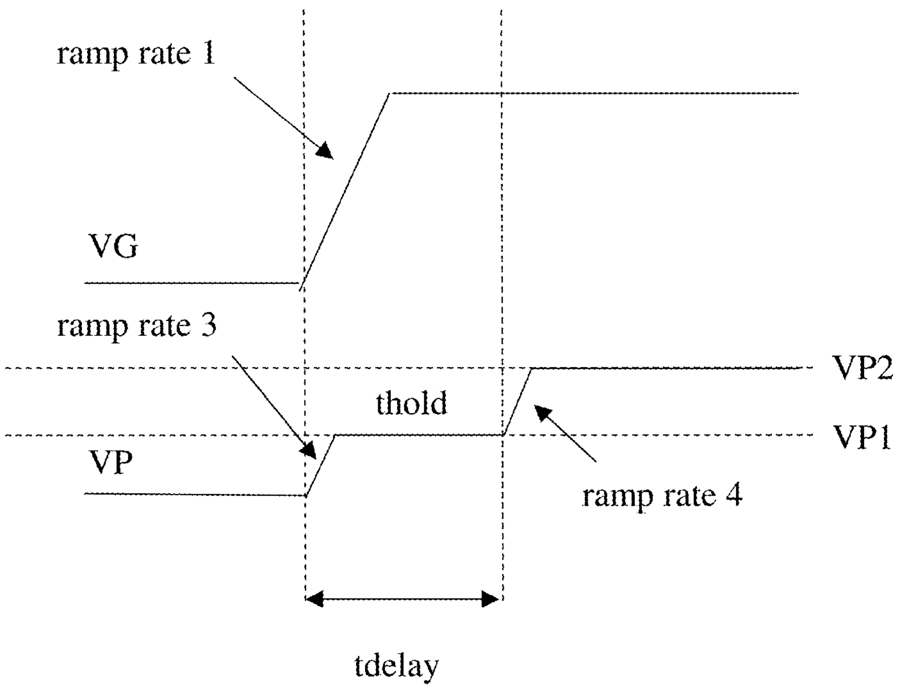

FIGS. 14A and 14B illustrate exemplary VG and VP waveforms that may be applied to switch on power devices 840. The VG and VP signals may start from zero or negative voltage, rising to a positive voltage to switch on power devices 840. The driver circuitry 830 may adjust the time delay tdelay between the rising of the VG and VP signals. The time delay tdelay is shown as positive, but tdelay may also be negative, that is the VP signal may rise earlier than the VG signal. Furthermore, the slew rate of the VG and VP signals may be independently controlled, shown as ramp rate 1 and ramp rate 2, respectively, in FIG. 14A.

In one exemplary embodiment, the VG voltage is rising from −5 volts to 10 volts, and the VP voltage is rising from −5 volts to 0.7 volts. In another exemplary embodiment, the VG voltage is rising from 0 volts to 10 volts, and the VP voltage is rising from 0 volts to 0.7 volts. Different output voltages VG and VP may be generated by the control circuitry 830 and the exemplary voltages described are not limiting.

FIG. 14B illustrates another example of VG and VP waveforms, where the VP signal may first settle at a first level VP1, before rising to the second level VP2. The slew rates ramp rate 3 and ramp rate 4, as well as holding time thold, which together will determine the time delay tdelay between the settling of VG and VP signals, may be independently controlled.

In one exemplary embodiment, the VP voltage is rising from −5 volts to the first level VP1 of 0 volts, before rising to the second level VP2 of 0.7 volts.

Figure 15A:
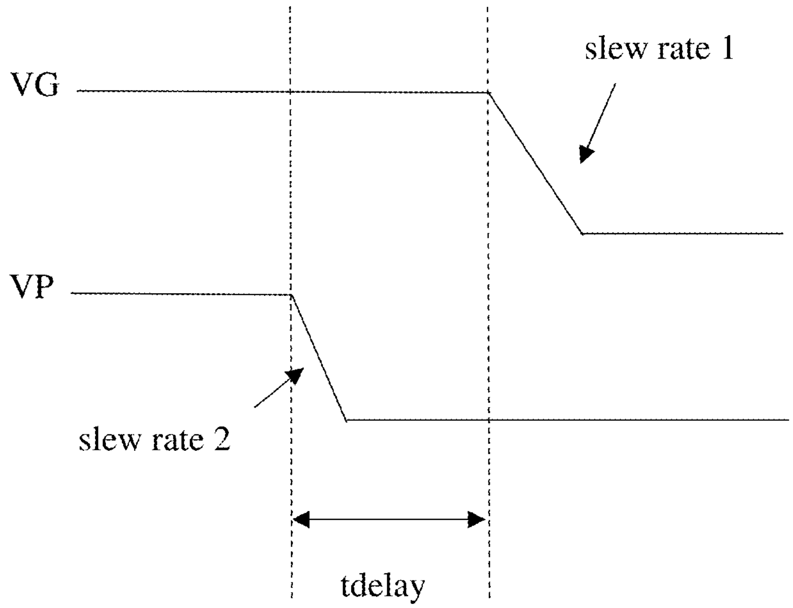
FIGS. 15A and 15B schematically illustrate output signals generated to turn off semiconductor power devices according to an embodiment of the present invention.
Figure 15B:
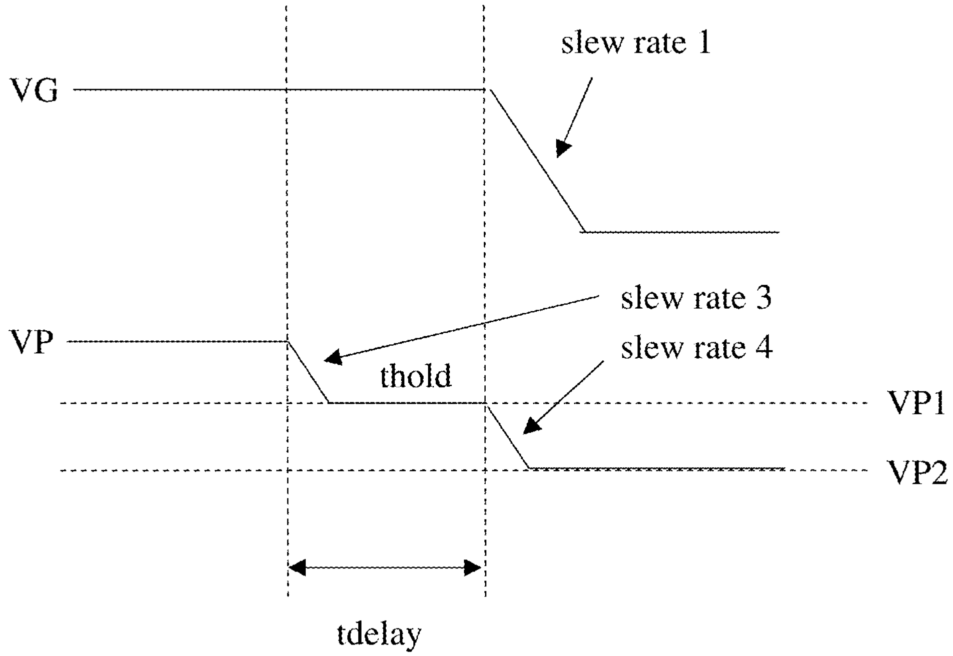

FIGS. 15A and 15B illustrate exemplary VG and VP waveforms that may be applied to switch off power devices 840. The VG and VP signals starts from a positive voltage to a final voltage of zero or negative voltage. The driver circuitry 830 may adjust the time delay tdelay between the falling of the VG and VP signals. The time delay tdelay is shown as positive, but tdelay may also be negative, that is the VG signal may fall earlier than the VP signal. Furthermore, the slew rate of the VG and VP signals may be independently controlled, shown as slew rate 1 and slew rate 2, respectively, in FIG. 15A.

In one exemplary embodiment, the VG voltage decreases from 10 volts to −5 volts, and the VP voltage decreases from 0.7 volts to −5 volts. In another exemplary embodiment, the VG voltage decreases from 10 volts to 0 volts, and the VP voltage decreases from 0.7 volts to 0 volts. Different output voltages VG and VP may be generated by the control circuitry 830 and the exemplary voltages described are not limiting.

FIG. 15B illustrates another example of VG and VP waveforms, where VP signal may first settle at a first level VP1, before decreasing to a second level VP2. The slew rates 3 and 4, as well as holding time thold, which together will determine the time delay tdelay between the settling of VG and VP signals, may be independently controlled.

In one exemplary embodiment, the VP voltage first decreases to the first level VP1 of 0 volts, before settling to the second level VP2 of −5 volts.

Figure 16A:
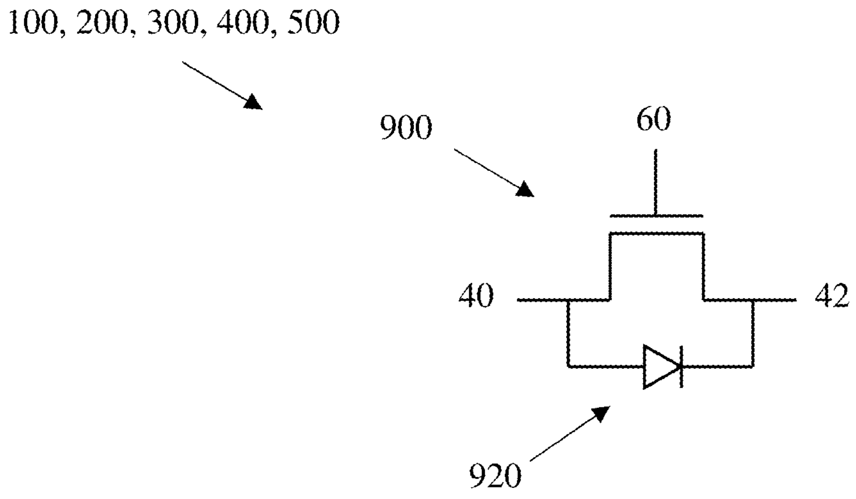
FIG. 16A (Prior Art)
FIG. 16A shows a prior art power device schematically represented as a MOSFET device in parallel with a diode.

Power devices 100, 102, 200, 300, 400, 500 comprise intrinsic diodes. For example, in LDMOS 100, the diode is formed by the body region 22 and the source region 16 as well as by the body region 22 and the drain regions (comprising the lightly doped region 24 and the drain region 18). Similarly, in VMOS 200, UMOS 300, VDMOS 400, and power device 500, the diode is formed by the base region 20 and the source region 16 and by the base region 20 and the drift region 18A (and the substrate region 18). Because the source electrode 40 electrically shorts the body region 22 or base regions 20 and the source regions 16, LDMOS 100, VMOS 200, UMOS 300, VDMOS 400, and power device 500 is often schematically represented as a MOSFET device 900 in parallel with a diode 920, where the diode 920 is connected between the source electrode 40 and the drain electrode 42 (see FIG. 16A). These diodes 920 can be used as a conducting path when the devices 100, 200, 300, 400, and 500 are turned off (for example, when about zero voltage is applied to the gate 60).

Figure 16B:
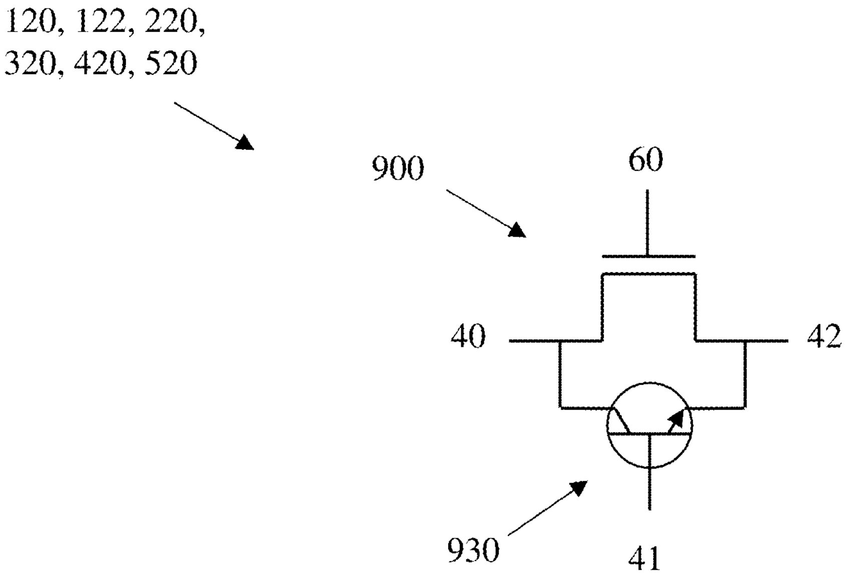
FIG. 16B shows a power device schematically represented as a MOSFET device and a bipolar transistor, according to various embodiments of the present invention.

In LDMOS 120, 122, VMOS 220, UMOS 320, VDMOS 420, and power device 520, the body electrode 41 allows for biasing to the body region 22 or base region 20. As a result, the current flow during through devices 120, 122, 220, 320, 420, and 520 can be modulated through the bias applied to the body electrode 41. For example, a higher current flow can be obtained by applying a positive bias to the body electrode 41. Similarly, a lower current flow can be obtained by applying a negative bias to the body electrode. Therefore, devices 120, 122, 220, 320, 420, and 520 may also be schematically represented as a MOSFET device 900 and a bipolar transistor 930 as shown in FIG. 16B.

Figure 17A:
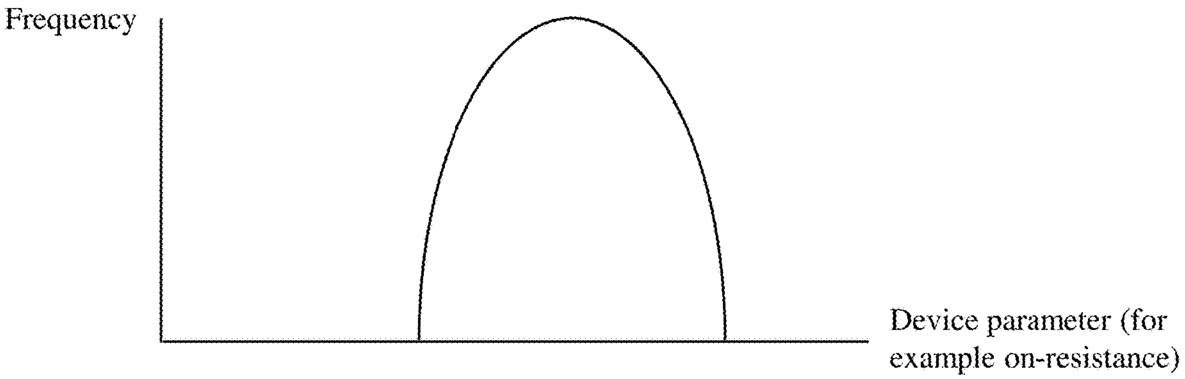
FIG. 17A (Prior Art)
FIG. 17A illustrates an exemplary distribution of a device parameter, for example, the on-resistance of a prior art power device.
Figure 17B:
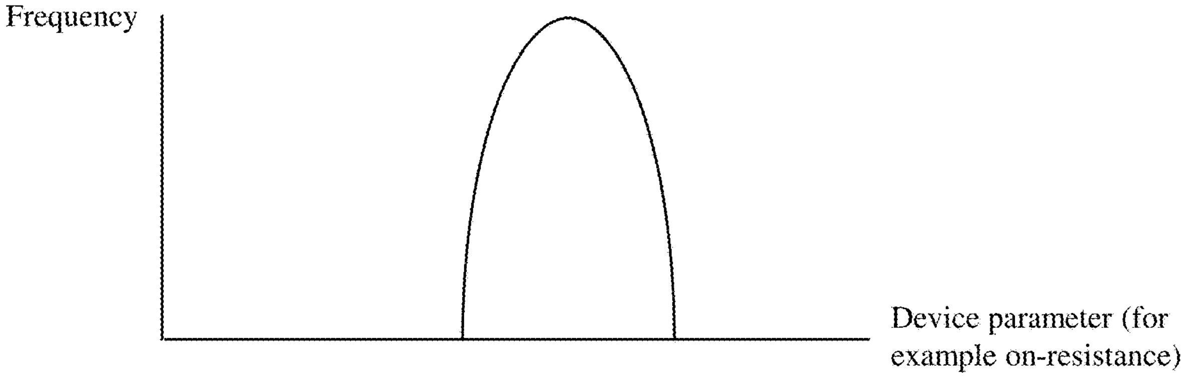
FIG. 17B illustrates an exemplary distribution of a device parameter, for example, the on-resistance of power devices in which a positive bias is applied to the body electrode of the power device with a higher initial on-resistance in order to lower the on-resistance, according to embodiments of the present invention.

Applying a bias to the body electrode 41 can also be used to reduce the device-to-device variation. FIG. 17A illustrates an exemplary distribution of a device parameter, for example, the on-resistance of power devices 100, 102, 200, 300, 400, 500, or 600. Application of a bias to the body electrode may improve the uniformity of the on-resistance of power devices 120, 122, 220, 320, 420, 520, or 620. For example, a positive bias can be applied to the body electrode 41 of a power device with a higher initial on-resistance in order to lower the on-resistance. As a result, a better device-to-device uniformity can be achieved, for example as illustrated in FIG. 17B.

The characteristics of the power devices may also shift over time, due to operation or aging. Biasing of the body electrode 41 may also be used to adjust the device parameter to return it to the desired state.

From the foregoing it can be seen that power devices having lower on resistance and higher breakdown voltage have been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

That which is claimed is:

1. A semiconductor power device comprising:
- a drain region;
- a first region contacting said drain region and having a same conductivity type as a conductivity type of said drain region, said first region being more lightly doped compared to a doping of said drain region;
- a source region;
- a second region in contact with said first region and said source region;
- a gate region;
- a gate insulator layer positioned at least in part between said gate region and said second region;
- a body electrode configured to provide bias to said second region; and
- a source electrode configured to provide bias to said source region;
- wherein said drain region is located below said first region;
- wherein independent control of said second region and said source region are enabled.

2. The semiconductor power device of claim 1, wherein, when in a conducting mode, application of a positive voltage to said second region while about zero voltage is applied to said source region, results in a higher current flow from said drain region to said source region, compared to configurations where said second region is shorted to said source region.

3. The semiconductor power device of claim 1, wherein, when in a conducting mode, a positive voltage is applied to said gate region, a positive voltage is applied to said drain region, about zero voltage is applied to said source region, and a positive voltage is applied to said second region.

4. The semiconductor power device of claim 1, wherein a positive bias applied to said second region turns on an intrinsic lateral bipolar transistor, wherein said source region functions as an emitter region of the intrinsic lateral bipolar transistor, said second region functions as a base region of the intrinsic lateral bipolar transistor, and said first region and said drain region function as a collector region of said intrinsic lateral bipolar transistor.

5. The semiconductor power device of claim 1, wherein, when said semiconductor power device is turned off, a negative bias is applied to said second region.

6. The semiconductor power device of claim 1,
- wherein said drain region comprises a substrate;
- wherein said first region comprises a drift region; and
- wherein said gate region and said gate insulator layer are formed inside a V-shaped groove cutting said source region, said second region, and into said drift region.

7. The semiconductor power device of claim 1,
- wherein said drain region comprises a substrate;
- wherein said first region comprises a drift region; and
- wherein said gate region and said gate insulator layer are formed in a U-shaped trench.

8. The semiconductor power device of claim 1, wherein current flows vertically from said drain region to said source region in a conducting state.

9. The semiconductor power device of claim 1,
- wherein said drain region comprises a substrate;
- wherein said first region comprises a drift region having a same conductivity type as a conductivity type of said substrate and being more lightly doped than said substrate;
- said semiconductor power device further comprising a vertical region in contact with said second region and said drift region, said vertical region having a different conductivity type from said conductivity type of said drift region.

10. A method of operating a semiconductor power device having a drain region, a first region contacting said drain region and having a same conductivity type as a conductivity type of said drain region and being more lightly doped than said drain region, wherein said drain region is located below said first region, a source region, a second region in contact with said first region and said source region, a gate region, a gate insulator layer positioned at least in part between said gate region and said second region, a body electrode configured to provide bias to said second region, and a source electrode configured to provide bias to said source region, said method comprising:
- applying a first bias from said body electrode to said second region; and
- applying a second bias from said source electrode to said source region;
- wherein said first and second biases are independently controlled.

11. The method of claim 10, wherein said method includes turning on said semiconductor power device by applying a positive voltage to said gate region and a positive voltage to said drain region,
- wherein the applying said second bias includes applying a bias of about zero voltage; and
- wherein the applying said first bias includes applying a positive voltage;
- wherein a higher current flow from said drain region to said source region results, compared to if said body electrode had been grounded.

12. The method of claim 10, wherein the applying said first bias to said second region includes turning on an intrinsic lateral bipolar transistor where said source region functions as an emitter region, said second region functions as a base region, and said first region and drain region function as a collector region of the intrinsic lateral bipolar transistor.

13. A method of operating a semiconductor power device having a drain region, a first region contacting said drain region and having a same conductivity type as a conductivity type of said drain region and being more lightly doped than said drain region, a source region, a second region in contact with said first region and said source region, a gate region, a gate insulator layer positioned at least in part between said gate region and said second region, a body electrode configured to provide bias to said second region, and a source electrode configured to provide bias to said source region, said method comprising:
- applying a negative bias to said second region when turning off said semiconductor power device.

14. The method of claim 13, wherein said applying said negative bias to said second region includes reducing a leakage current between said drain region and said source region when said semiconductor power device is turned off.

15. The method of claim 13, wherein said applying said negative bias to said second region includes improving a switch-off time of said semiconductor power device.

16. The method of claim 13, further comprising applying a negative bias to said gate region in conjunction with said applying said negative bias to said second region.

17. The method of claim 13, wherein said applying said negative bias includes applying a negative voltage bias.

18. The method of claim 13, wherein said applying said negative bias includes applying a negative current bias.

* * * * *